United States Patent [19]

Tan

[11] 4,399,426

[45] Aug. 16, 1983

[54] ON BOARD SELF-CALIBRATION OF ANALOG-TO-DIGITAL AND DIGITAL-TO-ANALOG CONVERTERS

[76] Inventor: Khen-Sang Tan, 709 Arbor Downs Dr., Plano, Tex. 75023

[21] Appl. No.: 260,435

[22] Filed: May 4, 1981

[51] Int. Cl.³ ............................................. H03K 13/02
[52] U.S. Cl. ...................... 340/347 CC; 340/347 AD; 340/347 DA; 364/571
[58] Field of Search ................. 340/347 AD, 347 CC, 340/347 DA; 364/571; 324/60 C, 62, 73 AT, 63

[56] References Cited

U.S. PATENT DOCUMENTS 4,129,863 12/1978 Gray ............................. 340/347 AD
4,222,107 9/1980 Mrozowski ................... 340/347 CC
4,272,760 6/1981 Prazak ........................... 340/347 CC

FOREIGN PATENT DOCUMENTS 2814754 10/1978 Fed. Rep. of Germany ...... 340/347 DA

OTHER PUBLICATIONS

Croisier, "IBM Technical Disclosure Bulletin" vol. 18, No. 8, Jan. 1976, pp. 2538-2539.
Schulz "IBM Technical Disclosure Bulletin" vol. 16, No. 1 Jun. 1973, pp. 137-138.

Primary Examiner—C. D. Miller
Attorney, Agent, or Firm—Thomas E. Tyson; Melvin Sharp; James T. Comfort

[57] ABSTRACT

A method and apparatus is disclosed which corrects for errors produced in data acquisition systems. Disclosed is a method and circuit for correcting errors, such as mismatch between binary weighted capacitors and offset, in a charge redistribution, weighted capacitor array analog-to-digital converter. A self-calibrating, self-correcting circuit is comprised of a second binary array of capacitors which adds to the regular charge redistribution capacitor array an error correcting signal to compensate for the mismatch. This error correcting signal is then stored and the other error correcting signals for other capacitors in the regular capacitor array are determined and subsequently stored for later correction of other capacitance mismatch.

11 Claims, 9 Drawing Figures

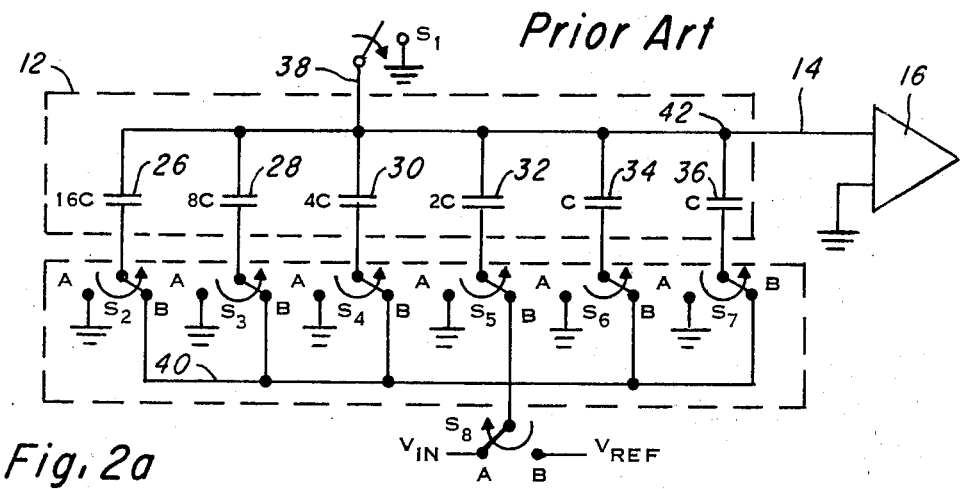
Fig. 2a  *Prior Art*
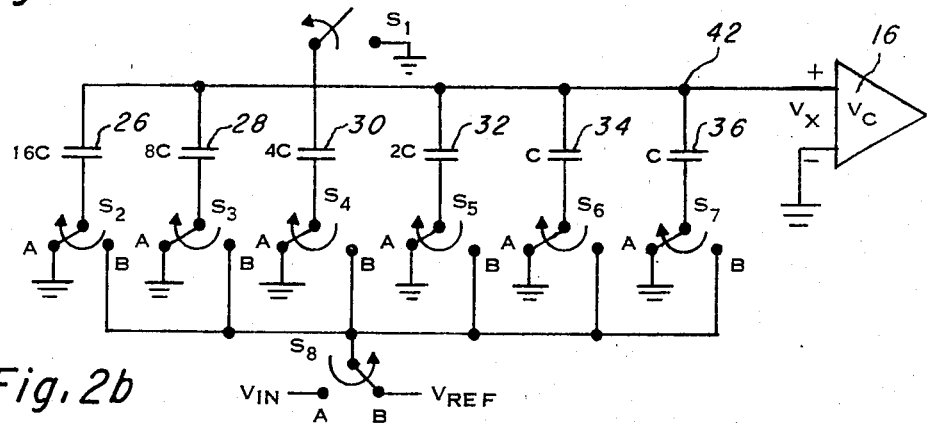
Fig. 2b
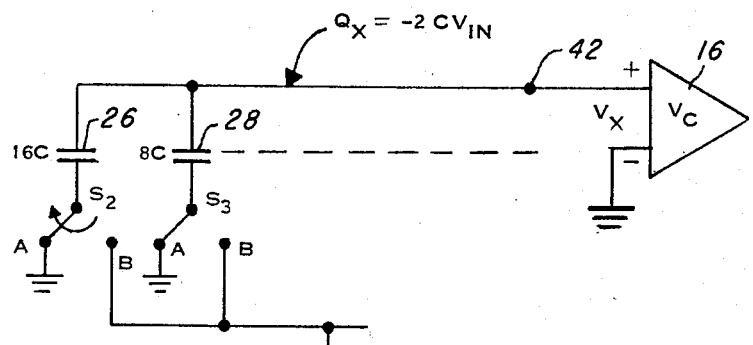
Fig. 2c
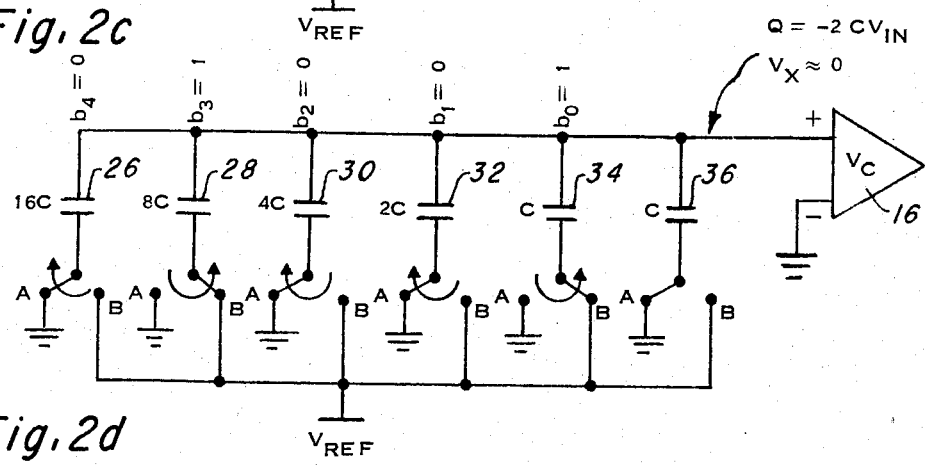
Fig. 2d

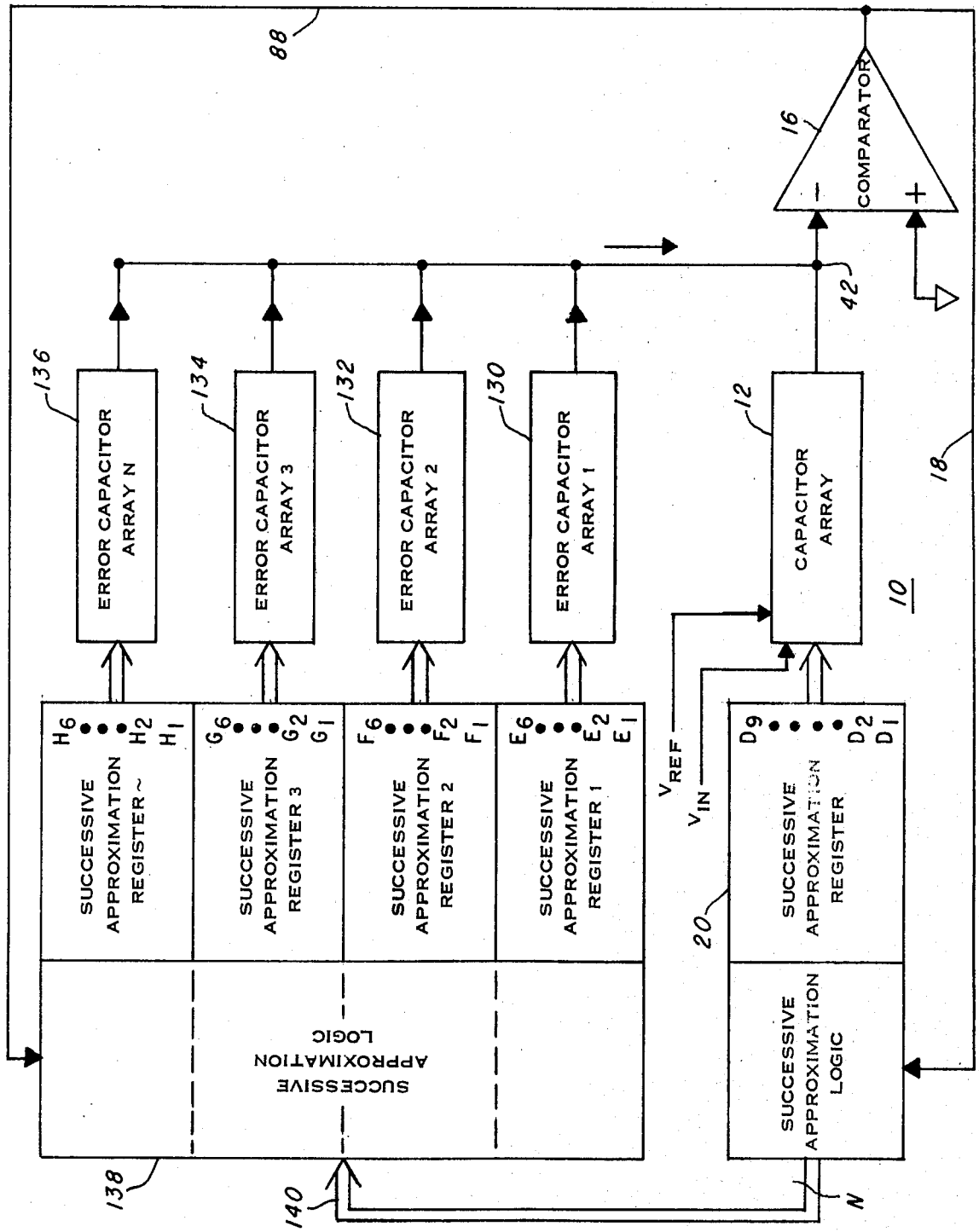

ON BOARD SELF-CALIBRATION OF ANALOG-TO-DIGITAL AND DIGITAL-TO-ANALOG CONVERTERS

This invention relates to a method and apparatus for correcting errors in a data acquisition system and more particularly to a method and apparatus for correcting the mismatch in a binary weighted component array.

An MOS device, used as a charge switch, has inherently zero offset voltage and as an amplifier has very high input resistance. In addition, capacitors are easily fabricated in integrated circuit technology. Therefore, one is led to use capacitors rather than resistors as the precision components in an analog-to-digital (A/D) or digital-to-analog (D/A) converter and to use charge rather than current as the working medium. This technique, referred to as charge-redistribution, is described in detail in the paper entitled "All-MOS Charge Redistribution Analog-to-Digital Conversion Techniques" by James L. McCreary and Paul R. Gray, IEEE Journal of Solid State Circuits, Volume SC-10, No. 6, December 1975, Pages 371–379. As discussed in this paper, a plurality of capacitors are used as the precision elements of an array and have values equal to C, C/2, C/4, C/8 .... The accuracy of the A/D (A/D will be used solely henceforth, but will be meant to include both A/D and D/A) converter using the charge redistribution technique is mainly determined by the matching of the capacitors in the array. Experimentally, it has been shown that in fabricating the capacitors utilizing MOS technology, acceptable ratio matching accuracies of up to 10 bits can be obtained with good yields. However, to achieve accuracy greater than 10 bits, external means such as laser trimming is required to change the size and value of the capacitors as required which, in turn, will increase the typical yield. However, laser trimming is a very expensive and time consuming procedure; to fabricate an A/D converter utilizing laser trimming techniques could cost in the order of a few hundred dollars.

Furthermore, prior art A/D converters require extremely accurate external calibrating voltages to calibrate the A/D converter. In other words, a very accurate, external analog signal is applied to the input of the A/D converter and the digital representation of that analog signal is read out. If the digital signal out differs from the analog signal input, the components are trimmed to acceptable limits. Then a second external analog calibrating signal is applied to the A/D converter and the digital representation of same is read out; this process is repeated until the components are trimmed and of the proper value to perform the necessary conversion from analog to digital form. However, this process is performed at the manufacturing site and is only performed once. Typically, however, the trimmed components are calibrated at room temperature (approximately 27° C.) and thus the converter may not be able to maintain the same accuracy with temprature variations and/or as a function of time. With such variations, the user has no way to go back and recalibrate the component array by additional laser trimming.

In the past, A/D converters have been manufactured as individual chips since they are very precise elements and have to be isolated from "noisy" (interferring) producing circuits, such as digital microprocessors. In order to achieve higher densities and reduced cost, it is very desirable to achieve an A/D converter which can be integrated on a single chip with a noisy circuit, such as a microprocessor, and which would allow automatic, self-calibration of the precision capacitive elements as required.

Accordingly, it is an object of the present invention to provide a method and apparatus for correcting errors in a precision component array.

Another object of the present invention is to provide a method and circuit for eliminating the binary mismatch and offset in a data acquisition system.

Another object of the present invention is to provide a method and apparatus for correcting errors in a precision component array which can be completely integrated on a single chip and requires no external calibrating voltages.

Another object of the present invention is to produce an A/D converter which can be combined on a single chip with other noisy circuits without degradation of performance of the A/D converter.

Another object of the present invention is to produce an A/D converter which is of high reliability and accuracy but low in cost to fabricate.

Another object of the present invention is to provide a self-calibration circuit for an A/D converter which is completely self contained and on the same chip with the A/D converter.

Another object of the present invention is to provide a self-calibration feature which can be incorporated on a single chip with the A/D converter and can be used by a user a plurality of times to produce a more accurate A/D converter.

Other objects and features of the invention will become more readily understood from the following detailed description and appended claims when read in conjunction with the accompanying drawings, in which like reference numerals designate like parts throughout the figures thereof, and in which:

FIGS. 2a–2d are schematic diagrams of the ADC of FIG. 1 during various phases of operation of the ADC.

FIG. 6 is an ADC according to the present invention with a plurality of error correcting capacitor arrays.

Figure 1:
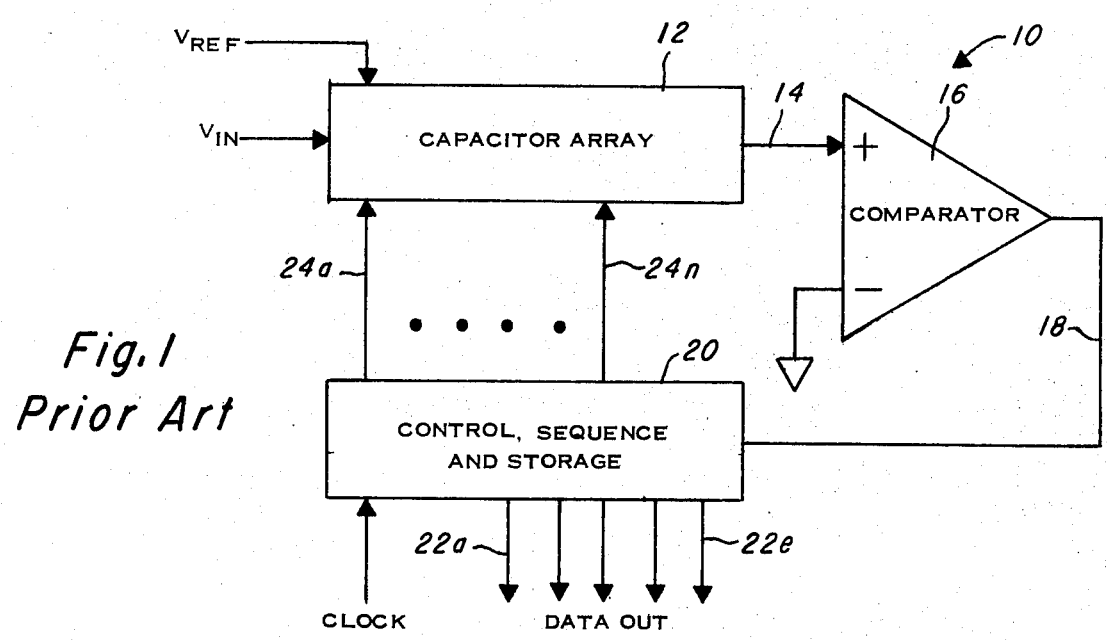
FIG. 1 is a block diagram of a prior art all-MOS charge redistribution analog-to-digital converter (ADC).

Referring now to FIG. 1, a prior art ADC 10 is disclosed similar to that described in the IEEE Journal of Solid-State Circuits, December 1975, Pages 371–379 entitled "All MOS Charge Redistribution Analog-to-Digital Conversion Techniques". The prior art ADC 10 is composed of a capacitor array 12 which is interconnected via conductor 14 to comparator 16. The output 18 of comparator 16 is connected to a control and sequencing circuit 20 which produces the digital data bits out on conductors 22a–22e. The control and sequencing circuit is comprised of logic circuits which activate switches (such as MOS transistor switches) via conductors 24a–24n to capacitor array 12. A reference voltage $V_{REF}$ and an input voltage $V_{IN}$ to be digitized are applied selectively to capacitor array 12.

FIGS. 2a–2d illustrate schematically the ADC 10 of FIG. 1. It can be seen that capacitor array 12 is comprised of a plurality of binary weighted capacitors 26–34, plus one additional capacitor 36 of weight corresponding to the least significant bit (LSB). As can be seen, the value of capacitor 28 is half the value of capacitor 26 while the value of capacitor 30 is half the value of capacitor 28 and so on (i.e., they are binarily weighted). These capacitors are connected in parallel; the top plate of capacitors 26-36 is connected to switch S1 which has an open position and when closed connects the top plate of each of capacitors 26-36 to ground. The top plate of capacitors 26-36 is connected to switch S1 by way of conductor 38. The top plate of capacitors 26-36 is also connected by way of conductor 14 to the positive terminal of voltage comparator 16. The negative side of voltage comparator 16 is grounded. The bottom plate of each of capacitors 26-36 is connected to switches S2-S7, respectively. Switches S2-S7 may be alternately connected to point A which is connected to ground or, as shown in FIG. 2a, can be connected to point B of each of said switches S2-S7 which is connected in common to conductor 40 which in turn is connected to switch $S_8$. As illustrated in FIG. 2a, switch S8 is connected to terminal A which has as its input the voltage to be digitized, namely $V_{IN}$. The reference voltage, $V_{REF}$ is connected to terminal B of switch $S_8$.

Analog-to-digital conversion is accomplished by a sequence of three operations. FIG. 2a illustrates the "sample mode". Initially, switch S1 is connected to ground and the bottom plates of capacitors 26-36 are connected via switch terminals S2B-S7B to the analog input voltage $V_{IN}$ through S8A. With the top plate of capacitors 26-36 grounded, the bottom plate of each of capacitors 26-36 is charged to a potential proportional to the input analog voltage $V_{IN}$.

FIG. 2b illustrates the next operation, namely the "hold mode". In this mode, switch S1 is opened and the bottom plates of capacitors 26-36 are connected to ground via switch terminals S2A-S7A. Since the voltage cannot change instantaneously across a capacitor, the potential at analog summing node 42 goes to a value equal to $-V_{IN}$.

The third step is called the "redistribution mode" and is illustrated in FIG. 2c. This mode utilizes the successive approximation technique and begins by testing the value of the most significant bit (MSB). This is accomplished by raising the bottom plate of capacitor 26 to the reference voltage $V_{REF}$ by switching switch S2 to the B terminal and switching switch S8 to its B terminal which is connected to $V_{REF}$. The equivalent circuit illustrated in FIG. 2c is actually a voltage divider between two equal capacitances. The voltage $V_X$ (at summing mode 42 which inputs comparator 16), which was equal to $-V_{IN}$ previously, is now increased by one half the reference voltage $V_{REF}$ as a result of this operation, or $$V_X = -V_{IN} + \frac{V_{REF}}{2}$$

Sensing the sign of $V_X$, comparator 16 produces a logic "1" if $V_X$ is less than 0 and is a logic "0" if $V_X$ is greater than 0. Therefore, this is analogous to the interpretation that if $V_X<0$, then $V_{IN}>VREF/2$ and hence the MSB=1; but if $V_X>0$, then $V_{IN}<VREF/2$ and therefore the MSB=0.

The output on conductor 18 (FIG. 1) of comparator 16 is the value of the binary bit being tested. Switch S2 is returned to ground (terminal A) only if the MSB $b_4$ is a 0. In a similar manner, the next MSB is determined by raising the bottom plate of the next larger capacitor (namely capacitor 28) to $V_{REF}$ and checking the polarity of the resulting value of $V_X$. In this case, however, the voltage division property of capacitor array 12 causes $V_{REF}$ to be added to $V_X$ such that $V_X$ is defined as follows:

$$V_X = -V_{IN} + b_4 \frac{V_{REF}}{2} + \frac{V_{REF}}{4}$$

Conversion proceeds in this manner until all the bits have been determined. FIG. 2d illustrates the final configuration of the capacitor array 10 for the digital output 01001. It will be noted that N redistributions are required for a conversion resolution of N bits. The logic output from comparator 16 on conductor 18 inputs circuit 20 which produces logic signals to activate, control and sequence the necessary opening and closing of switches S1-S8.

The charge distribution technique described with respect to the analog-to-digital converter of FIG. 1 has certain factors which limit the accuracy of the system. Exemplary of such errors is the problem of matching the capacitors in a binary weighted relationship. A mismatch in the binary ratios of capacitors 26-36 in array 12 causes nonlinearity in the ADC 10. Also, linearity of the system is very sensitive to a fractional change in the large capacitors but is not very dependent upon similar fractional changes in the smaller capacitors. Accordingly, the smaller capacitors have greater allowable tolerances.

Figure 3:
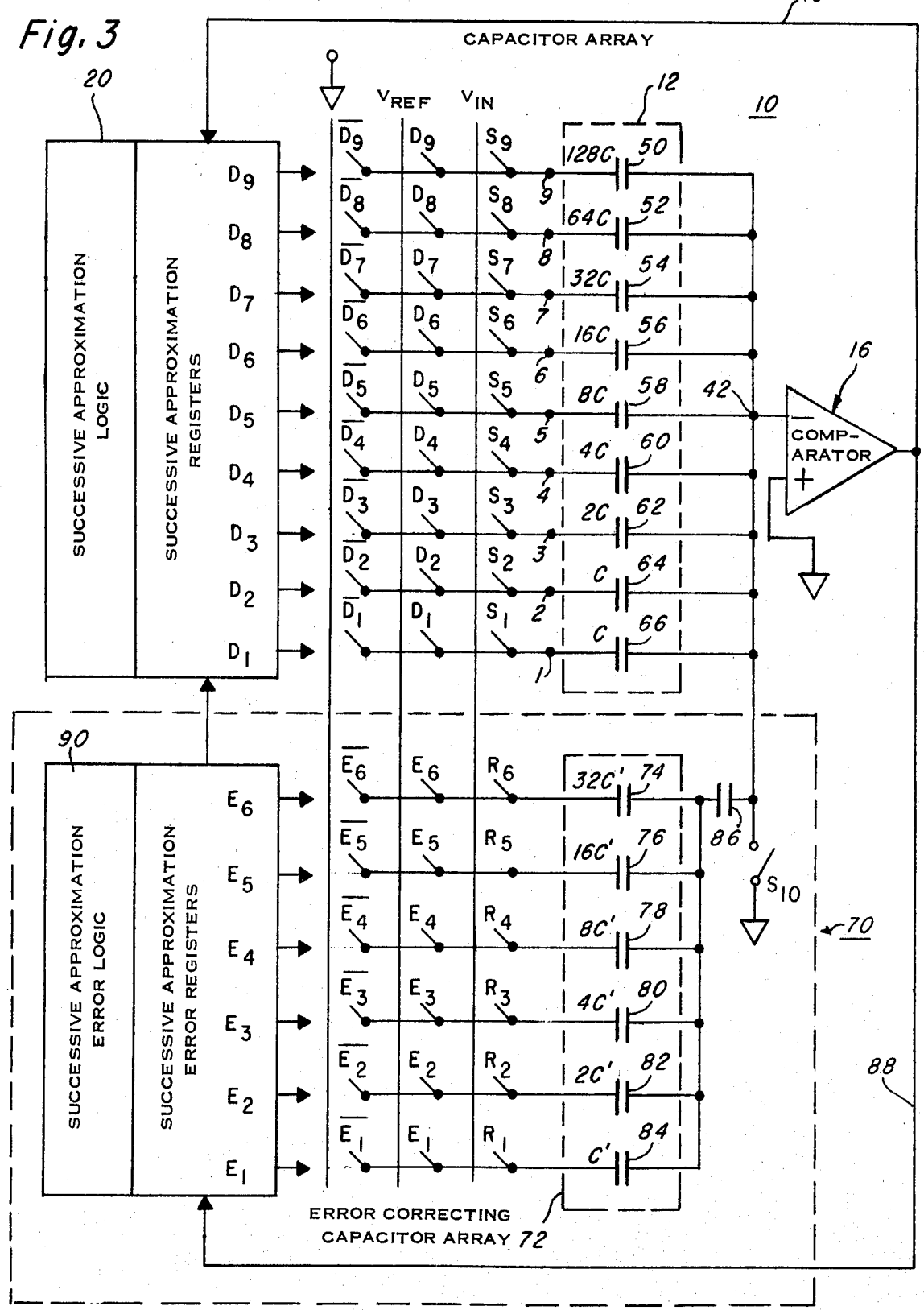
FIG. 3 is a schematic design of the self-correcting ADC according to the present invention.

FIG. 3 illustrates the circuitry according to the present invention utilized to determine the mismatch in a weighted array, such as the binary weighted capacitor array 12. Disclosed is a charge redistribution A/D converter 10 such as was described with respect to FIGS. 1 and 2A-2D. A/D converter 10 is comprised of a binary weighted capacitor array 12 comprised of a plurality of binary weighted capacitors 50-64 plus one additional capacitor 66 of weight corresponding to the least significant bit (LSB); the top plate of the capacitor array is connected to a summing node 42 which in turn is connected to the negative side of comparator 16. The positive input side of comparator 16 is grounded. The bottom plate of capacitors 50-66 are connected to a plurality of switches S1-S9, D1-D9 and $\overline{D1}$-$\overline{D9}$; these switches connect the bottom plates of capacitors 50-66 to the signals $V_{IN}$, $V_{REF}$, and ground, respectively. Switches S1-S9 in FIG. 3 correspond in function to switch S8 in FIG. 2A when connected to its A terminal. Switches D1-D9 in FIG. 3 correspond in function to switch S8 when connected to the B terminal in FIG. 2B. Switches $\overline{D1}$-$\overline{D9}$ correspond in function to switches S2-S7 in FIG. 2D when connected to the A terminal.

Logic circuitry 20 corresponds in function to the control, sequencing and storage circuit 20 in FIG. 1; logic circuit 20 is comprised of successive approximation logic as well as successive approximation registers having outputs D1-D9 and $\overline{D1}$-$\overline{D9}$. Typical of logic circuit 20 is the part number DM2503 manufactured and sold by National Semiconductor.

The ADC 10 illustrated in FIG. 3 works in the same manner as that described with respect to FIGS. 1 and 2A-2D. As mentioned previously, if capacitors 50-64 are mismatched with respect to their binary ratios (i.e.

capacitors $50 = 2\times$ capacitor $52 = 4\times$ capacitor $54\ldots$), a nonlinearity error is injected into ADC 10 which reduces the accuracy of the system. Also, as mentioned earlier, the smaller capacitors, such as capacitors 60–66, have greater allowable tolerances as far as their mismatch is concerned whereas the larger capacitors are very sensitive to a fractional change in the mismatch of their binary ratios.

According to the present invention, an additional error correcting circuit 70 is connected to summing node 42 for determining the binary mismatch between one or all of capacitors 50–66 and producing an error correcting signal to node 42 to substantially eliminate the effects of such mismatch. Circuit 70 is comprised of an error correcting capacitor array 72 having a plurality of binary weighted capacitors 74–82 plus one additional capacitor 84 of weight corresponding to the least significant bit (LSB). The top plate of capacitors 74–84 are connected in common to the bottom plate of coupling or scaling capacitor 86 (having a value of $_aC$, where a typical value of a is 2). The top plate of capacitor 86 is connected to one side of switch S10 while the other side of switch S10 is connected to ground.

The bottom plates of capacitors 74–84 are connected to a series of switches R1–R6, E1–E6 and $\overline{E1}$–$\overline{E6}$ in a manner similar to that described with respect to ADC 10. Switches R1–R6, E1–E6 and $\overline{E1}$–$\overline{E6}$ are connected respectively to the signals $V_{IN}$, $V_{REF}$, and ground, respectively. Additionally, the output of comparator 16 is transmitted through conductor 88 to logic circuit means 90. Logic circuit means 90 is comprised of successive approximation error logic as well as successive approximation error registers (SAR). Logic circuit means 90 may be part number DM2503 manufactured and sold by National Semiconductor. As configured, error correcting circuit means 70 is, in essence, a second digital-to-analog converter which operates in a similar manner to ADC 10 and is connected to summing node 42. The total number of binary weighted capacitors 74–84 in error correcting capacitor array 72 is determined by the desired minimum correction step size, while the size of capacitor 86 is determined by the expected maximum error of capacitor array 12.

For purposes of explanation of operation of the circuit, it will be assumed that it is desired to correct the binary mismatch between capacitors 50–56 (which will be designated $C_{50}$, $C_{52}$, $C_{54}$ and $C_{56}$). Initially, successive approximation registers (SAR) D9–D1 and E6–E1 are set as follows:

$$\{D_9 D_8 D_7 D_6 D_5 D_4 D_3 D_2 D_1\} \text{ and } \{E_6 E_5 E_4 E_3 E_2 E_1\}$$
$$\{0\ 0\ 0\ 0\ 1\ 1\ 1\ 1\ 1\} \quad \{0\ 0\ 0\ 0\ 0\ 0\}$$

and reset switch S10 is closed to reset node 42 to zero or ground. With D1–D5 all equal to logic "1", capacitors 58–66 are connected to $V_{REF}$ and charged up to a voltage equal to $V_{REF}$. Then, switch S10 is opened and SAR's D9–D1 are set to $\{000100000\}$. Since nodes 1–5 are switched from $V_{REF}$ to zero and node 6 is switched from zero to $V_{REF}$, then the voltage at summing node 42 is proportional to the following:

$$V_{NODE42} \propto V_{REF} C_{56} - V_{REF}(C_{66}+C_{64}+C_{62}+C_{60}+C_{58})$$

If there is no error in the mismatch between $C_{58}$–$C_{66}$ and $C_{56}$ or $$C_{56} = C_{66}+C_{64}+C_{62}+C_{60}+C_{58},$$

then the voltage at node 42 will be exactly zero. However, for example, if $C_{56}$ is slightly less than the summation of $C_{58}$–$C_{66}$ or $$C_{56} < C_{66}+C_{64}+C_{62}+C_{60}+C_{58},$$

then the voltage at summing node 42 will be negative and comparator 16 will generate a high output (logic 1). This negative voltage at summing node 42 is proportional to the amount of binary mismatch (or error) of capacitor $C_{56}$ with respect to the summation of capacitors $C_{58}$–$C_{66}$ (or $C_{66}+C_{64}+C_{62}+C_{60}+C_{58}$).

The amount of error of capacitor $C_{56}$ can be determined by successively ramping up the error correcting (digital-to-analog converter) circuit 70. The output of successive approximation registers E1–E6 are successively increased until the voltage output from error correcting capacitor array 72 at summing node 42 is just greater than zero, that is, when the output from comparator 16 changes back from a high to a low. The digital word in the successive approximation registers E1–E6 in logic means 90 then corresponds to the digital representation of the binary mismatch or error in capacitor $C_{56}$. This digital word is then stored in a memory in a manner to be described hereinafter. To determine the error of capacitor $C_{54}$, switch S10 must be closed to reset summing node 42 to zero. The successive approximation logic and logic circuit means 20 then sets SAR's D9–D1 as follows:

$$\{D_9 D_8 D_7 D_6 D_5 D_4 D_3 D_2 D_1\}$$
$$\{0\ 0\ 0\ 1\ 1\ 1\ 1\ 1\ 1\}$$

The successive approximation error logic of logic circuit 90 sets SAR's E1–E6 to the digital representation of the error code of capacitor $C_{56}$ or $$\{E_6 E_5 E_4 E_3 E_2 E_1\} = \{\text{error code of } C_{56}.\}$$

It should be noted that $$C_{66}+C_{64}+C_{62}+C_{60}+C_{58}+C_{56}+\text{error in } C_{56}) = 2(C_{66}+C_{64}+C_{62}+C_{60}+C_{58}).$$

After completing the above, switch $S_{10}$ is opened and registers D9–D1 are set to $\{001000000\}$ by the successive approximation logic in logic circuit means 20. Similarly, successive approximation error logic circuitry in circuit means 90 sets registers E6–E1 as follows:

$$\{E_6 E_5 E_4 E_3 E_2 E_1\}$$
$$\{0\ 0\ 0\ 0\ 0\ 0\}$$

Since $C_{54}$ (node 7) is switched from zero to $V_{REF}$ and nodes 1–6 are switched from $V_{REF}$ to zero, then the voltage at summing node 42 will be proportional to $$V_{NODE} \\ 42 \propto V_{REF} C_{54} - \\ V_{REF}[C_{66}+C_{64}+C_{62}+C_{60}+C_{58}+C_{56}+\text{error in } C_{56}].$$

If $C_{54}$ is exactly equal to the term within the brackets of the above equation, then the voltage at node 42 will be zero. In other words, if the voltage at node 42 is zero, there is a perfect binary match between capacitor $C_{54}$ and the summation of capacitors $C_{56}$–$C_{66}$ plus the error previously determined in capacitor $C_{56}$ and injected by error correcting circuit 70 at node 42. If $C_{54}$ is slightly less, for example, than the term in brackets in the above equation, then the voltage at summing node 42 will be less than zero and the output of comparator 16 will be high. The magnitude of the voltage at summing node 42 is proportional to the amount of binary mismatch or error of capacitor $C_{54}$. Again, this error can be determined by successively ramping up the successive approximation registers E1–E6 of error correcting circuit 70 until the output of comparator 16 changes from high to low. The digital word in registers E1–E6 then corresponds to the digital representation of the binary mismatch of capacitor $C_{54}$. This digital word in E1–E6 is then stored in memory.

To determine if there is a binary mismatch in capacitor $C_{52}$, the above procedure is essentially duplicated as follows. Switch S10 is closed, thereby grounding the summing node 42. SARs D9–D1 are set as follows:

$$\{D_9 D_8 D_7 D_6 D_5 D_4 D_3 D_2 D_1\}$$
$$\{0\ 0\ 1\ 1\ 1\ 1\ 1\ 1\ 1\}$$

It is important to note at this point that the error correcting circuit 70 is injecting a voltage into node 42 which is correcting for the binary mismatch between the capacitors. The preceding steps of the method have shown that an error exists in capacitor $C_{56}$ and capacitor $C_{54}$. To correct for any binary mismatch in capacitor $C_{52}$, the sum of the errors for capacitors $C_{54}$ and capacitors $C_{56}$ must be inserted at node 42 by the error correcting circuit 70. In other words, successive approximation error registers E1–E6 must be set to the digital representation of the word which corresponds to the sum of the error code of capacitor $C_{56}$ plus the error code of the capacitor $C_{54}$ or $$\{E_6 E_5 E_4 E_3 E_2 E_1\} = \{\text{error code of } C_{56} + \text{error code of } C_{54}.\}$$

Switch S10 is then opened and registers D9–D1 are set as follows.

$$\{D_9 D_8 D_7 D_6 D_5 D_4 D_3 D_2 D_1\} =$$
$$\{0\ 1\ 0\ 0\ 0\ 0\ 0\ 0\ 0\}$$

and registers E6–E1 are set to zeros. As described hereinabove, the binary mismatch or error in capacitor $C_{52}$ can then be determined and stored as required. This procedure is then repeated for capacitor $C_{50}$. Thus it can be seen that through the use of an additional error correcting circuit 70, calibration of the ADC 10 can be obtained. Utilizing MOS technology, this can be obtained on the same chip with the further advantage of requiring no precise outside calibrating sources to calibrate the ADC 10; in other words, it is completely self contained.

The above describes a method of calibrating a plurality of binary weighted capacitors $C_1$–$C_N$ plus one additional capacitor $C_0$ of weight corresponding to the least significant bit of the array in combination with an error correcting A/D-D/A correcting capacitor array combined at an analog summation node in which the summation node is initialized by grounding the node; then a first signal of one polarity and magnitude is applied to $C_0$ and a second signal of opposite polarity but same magnitude is applied to $C_1$ with the resulting signal $E_1$ at the summing node being proportional to the binary mismatch in capacitor $C_1$. This signal $E_1$ is then converted into a digital signal using an error correcting capacitor array. To find the error in capacitor $C_2$, a third signal of one polarity and magnitude must be applied to capacitors $C_0$ and $C_1$ and a fourth signal of opposite polarity but same magnitude must be applied to capacitor $C_2$; then error signal $E_1$ must be converted into an analog signal and applied to the analog summing node with the resulting analog signal $E_2$ at the summing node being proportional to the error in capacitor $C_2$. Capacitor error signal $E_2$ may then be converted into a digital signal and stored for later use. These steps are repeated as many times as necessary to correct for the required number of binary weighted capacitors.

Figure 4:
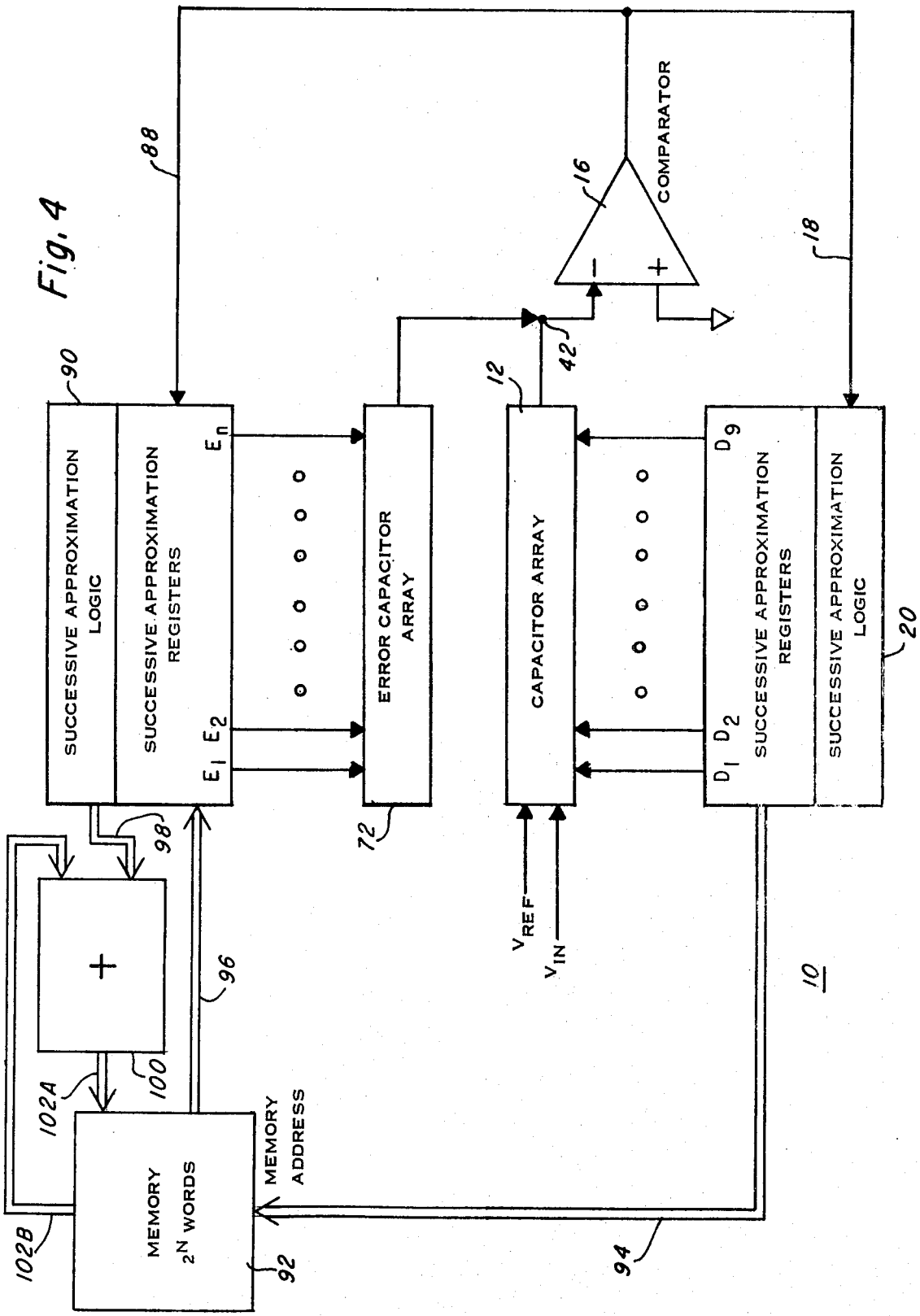
FIG. 4 is a block diagram of the ADC of FIG. 3 with one memory configuration.

FIG. 4 illustrates a block diagram of FIG. 3 further including a memory such as a random access memory (RAM) lookup table. A memory address bus 94 is interconnected between logic circuit 20 and RAM 92. An output bus 96 interconnects memory 92 and logic circuit 90. The output of logic circuit 90 forms one input to digital adder 100. The output 102A of digital adder 100 is input to memory 92 while the other output 102B from memory 92 is fed back and forms the second input to digital adder 100.

As described with reference to FIG. 3, the binary mismatch in the capacitors $C_{50}$–$C_{56}$ can be readily determined without using any external calibration voltages. Assume for purposes of discussion that it is desired to correct the binary mismatch of capacitors $C_{50}$–$C_{56}$. Error capacitor array 72 determines the error for capacitor 56, and this digital value is stored in memory 92; next the procedure is repeated and the error for capacitor 54 is determined by error capacitor array 72. The digital representation of such error is transmitted through adder 100 and stored in memory 92; the digital representation of the error code for capacitor 54 is fed back and is combined with the digital representation of the error code for capacitor $C_{56}$ with the resultant stored in memory 92. This procedure is repeated until the error codes for each of capacitors $C_{56}$-$C_{50}$ and their summations are all stored in memory. For correcting the four most significant bits (N=4), $2^4$ or 16 words of storage in memory 92 is required. Logic circuit 20 determines which capacitors in capacitor array 12 will be utilized and therefor requires correction. A memory address signal on bus 94 from logic circuit 20 accesses the proper memory location and transmits the digital representation of the error signal via bus 96 to the successive approximation registers $E_1$–$E_N$; this, in turn, causes error capacitance array 72 to inject a correction signal at summing node 42 to correct for the binary mismatch in the capacitor array 12.

In general, at memory location D9 D8 D7 D6 the error information to be stored is $$\{D_9 * C_{50}\ \text{error} + D_8 * C_{52}\ \text{error} + D_7 * C_{54}\ \text{error} + D_6 * C_{56}\ \text{error}\}.$$

As an example, for an address location where $D_9 D_8 D_7 D_6 = 1101$ the memory will store the following error information $$\{C_{50}\ \text{error} + C_{52}\ \text{error} + C_{56}\ \text{error}\}.$$

In like manner, at memory location address D9 D8 D7 D6=0101, memory 92 will store the following error information $$\{C_{52}\ \text{error} + C_{56}\ \text{error}\}.$$

This procedure is repeated for each error in capacitors $C_{50}$–$C_{56}$ and each combination thereof. In other words, the error for capacitor $C_{50}$, $C_{52}$, $C_{54}$ and $C_{56}$ are each stored in a location in memory (four locations, namely, 1000, 0100, 0010 and 0001 in the address locations). The other twelve memory spaces are for the summations of these or permutations of these four capacitor errors. In operation, when capacitor array 12 is operating and the input voltage $V_{IN}$ is such that capacitors $C_{52}$ and $C_{56}$ are being utilized, logic circuit 20 will produce a memory address of 0101 on bus 94 to memory 92 which will cause memory 92 to output on bus 96 the error information for $C_{52} + C_{56}$. This digital representation will cause the successive approximation registers in logic circuit 90 and the error capacitance array 72 to produce a signal which compensates for the error in capacitors $C_{52}$ and $C_{56}$. In other words the four most significant bits of the successive approximation registers of logic circuit 10 addresses the RAM memory 92. The memory 92 then inserts the digital representation of the particular capacitance(s) error to the error correction capacitor array 72. By combining the capacitance array 12 with the error correcting capacitance array 72, accurate ADC is achieved. It is important to note that the time to retrieve capacitor error information from memory 92 should be less than the bit conversion time of analog-to-digital converter 10.

Figure 5:
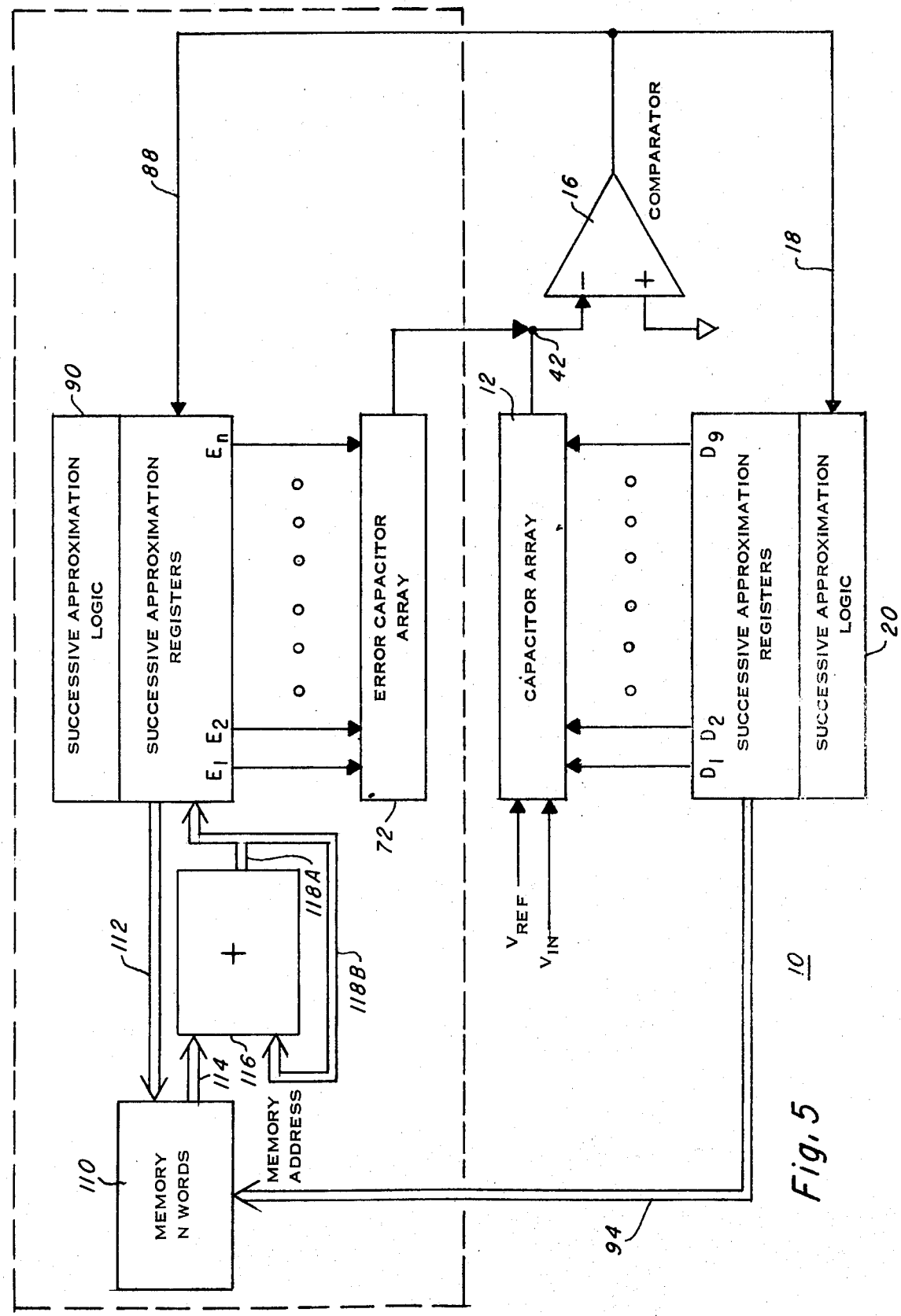
FIG. 5 is a block diagram of the ADC of FIG. 3 with another memory configuration.

FIG. 5 illustrates a variation of the analog-to-digital converter illustrated in FIG. 4. This variation allows for a smaller memory capacity to be utilized over that illustrated in FIG. 4. As shown in FIG. 5, the output from error logic circuit 90 is fed directly by bus 112 to a memory 110 having N words of memory. The output from memory 110 is coupled by bus 114 to a digital adder 116. One output of digital adder 116 is fed via bus 118A to logic circuit 90 while the other output 118B is fed back as an input to digital adder 116. In this embodiment, the number of words required to be stored in memory equals the number of most significant bits or capacitors that will be corrected. In our preceding example, since four capacitors $C_{50}$–$C_{56}$ were corrected, only four storage words are required in memory 110. If the capacitor array 12 indicates that, for example, capacitor $C_{50}$ and $C_{52}$ are being utilized, then memory address bus 94 accesses the digital representation of those errors in memory 110 and they are combined in digital adder 116 and transmitted by bus 118A to logic circuit 90. The error capacitance array 72 then produces an error correcting signal which is transmitted to node 42 to null out the error in capacitances $C_{50}$ and $C_{52}$. As would be expected, in the embodiment of FIG. 5, the time it takes to retrieve capacitor error information is equal to the access time of memory 110 plus the addition time required by adder 116 (typically this time is in the order of a few microseconds). In the embodiment of FIG. 4, the time required to retrieve capacitor error information is just the access time of memory 92, which is typically a few tenths of a microsecond. Since the A/D conversion time must be greater than the time it takes to retrieve error information, the A/D conversion rate in the embodiment of FIG. 4 is faster than the embodiment of FIG. 5.

FIG. 6 illustrates another embodiment of the present invention which requires no memory such as that illustrated in FIGS. 4 and 5. The analog to digital converter 10 disclosed in FIG. 6 operates in the same manner as that illustrated in FIG. 3 and described hereinabove. In contrast to the previous embodiments described, a plurality of error capacitor arrays 130–136 are connected in common to summing node 42. There are "N" error capacitor arrays, one corresponding to each capacitor in capacitor array 12 which is to be calibrated and binarily matched. Logic circuit 138 is comprised of a plurality of successive approximation registers and successive approximation logic circuitry for each of the error capacitor arrays 130–136. The output from logic circuit 120 in ADC 10 is connected by a bus 140 composed of "N" lines to logic circuit 138.

Assume, for purposes of discussion and explanation, that "N"=4. This would mean that it is desired to correct the four most significant bits in capacitor array 12; namely, error capacitor array 1 would correct the binary mismatch in capacitor $C_{56}$ (FIG. 3), error capacitor array 2 would correct the binary mismatch in capacitor $C_{54}$ (FIG. 3), error capacitor array 3 would correct the binary mismatch in capacitor $C_{52}$ (FIG. 3), and error capacitor array 4 (array 136) would correct the binary mismatch in capacitor $C_{50}$ (FIG. 3) in capacitor array 12.

Error capacitor array 1 calculates the binary mismatch in capacitor $C_{56}$ in the same manner as described with respect to FIG. 3. The digital representation of that mismatch is stored in successive approximation registers E1–E6 in logic circuit 138. In like manner the binary mismatch for capacitor $C_{54}$ is determined by error capacitor array 2 and the digital representation of same is stored in successive approximation register 2, F1–F6, in logic circuit 138. This is repeated for error capacitor array 3 and 4. In other words, the error codes of capacitors $C_{56}$–$C_{50}$ are stored in SAR's E1–E6 through H1–H6, respectively. When any or all of capacitors $C_{50}$–$C_{56}$ are utilized in capacitor array 12 logic circuit 20 via bus 140 activates the appropriate successive approximation registers in logic circuit 138 to produce signals from error capacitor arrays 130–136 to calibrate or correct the binary mismatch produced in capacitor array 12.

It should be noted that the above method and apparatus for correcting errors in precision elements or components is not limited to charge redistribution capacitor arrays, but can be used for other data acquisition systems, such as resistive ladders, etc. Furthermore, it should be pointed out that the method or procedure used to determine capacitor errors in capacitor array 12 can also be used to determine the offset error in comparator 16. To determine offset error, the same technique is utilized as is utilized for determining the mismatch in binary weighted capacitors. Since the approach described hereinabove requires only switches, capacitors and logic for its implementation, such implementation is readily implemented in integrated circuit form using MOS technology. Also, since no external precision calibrating voltages are needed for calibration, as has been heretofore required, an ADC or DAC implemented using this approach can be recalibrated whenever needed or whenever power supplies are switched on. The accuracy of such a data acquisition system can therefore be guaranteed throughout all temperature variations and the long term stability is assured. With the self-calibrating technique and circuit discussed and described above, the accuracy of an ADC/DAC is no longer limited by the precision elements matching. Thus, with this type of approach, monolithic, untrimmed DAC/ADC of accuracy of 14 bits or more may be realizable with high yield using MOS technology.

Although the present invention has been shown and illustrated in terms of a specific method and apparatus, it will be apparent that changes or modifications can be made without departing from the spirit and scope of the invention as defined by the appended claims.

What is claimed is:

1. A self calibrating charge-redistribution analog-to-digital converter comprising:
    a first binary weighted capacitor array having a plurality of capacitors, one plate of each of said capacitors being electrically connected to a node,
    a comparator having one input electrically connected to said node,
    first logic means connected to said comparator output and said array for selectively connecting said capacitors to preselected voltages, and
    at least one second binary weighted error capacitor array electrically connected to said node and having a plurality of capacitors for determining the error correcting signal required at said node to correct the binary mismatch of preselected capacitors in said first array, each said capacitors in said error capacitor array being connected through a scaling capacitor to said node.

2. A converter according to claim 1 further including second logic means connected to said error capacitor array for reproducing a digital representation of said error signal which causes said second error capacitor array to produce the analog representation of said error signal at said node each time said preselected mismatched capacitors are utilized in said first array.

3. A converter according to claim 1 wherein said first binary array includes one additional capacitor which is equal to LSB capacitor.

4. A converter according to claim 1 further including a predetermined number of additional binary weighted error capacitor array electrically connected to said node, each having a plurality of capacitors, each of said arrays determining the error signal required at said node to correct the binary mismatch of preselected capacitors of said array.

5. A converter according to claim 4 wherein said predetermined number of error capacitor arrays corrects the capacitor in said first array associated with the MSB and a selected number of the more significant bits.

6. A converter according to claim 4 further including logic means connected to each of said predetermined number of error capacitor arrays for producing a digital signal to each of said error capacitor arrays representative of the mismatch of said preselected capacitors.

7. A converter according to claim 6 wherein each of said digital signals from said respective logic means is input to its respective error capacitor array to produce an analog error signal representative of the mismatch of the binary weighted capacitors in said first array.

8. A converter according to claim 1 further including a memory means interconnected between said first and second logic means for storing the digital representations of the mismatch in the binary weighted capacitors in said first array.

9. A converter according to claim 8 wherein said memory has storage capacity of $2^N$ where N equals the number of bits to be corrected.

10. A converter according to claim 8 wherein said memory has storage capacity of N, where N equals the number of bits to be corrected.

11. A method of calibrating capacitors $C_1$-$C_N$ in an A/D-D/A having a binary weighted capacitor array $C_1(LSB)$, $C_2$, $C_3$, $C_4$ . . . $C_N(MSB)$ plus one additional capacitor $C_0$ of weight corresponding to the least significant bit (LSB) in combination with an error correcting capacitor array combined at an analog summation node, comprising the steps of:

(1) initializing the summation node to zero,
    (2) applying a first signal of one polarity and magnitude to $C_0$ and a second signal of opposite polarity but same magnitude to $C_1$ with the resulting signal $E_1$ at the summing node being proportional to the error in capacitor $C_1$,
    (3) converting signal $E_1$ into a digital signal using said error correcting capacitor array,
    (4) initializing the summation node again to zero, a
    (5) applying a third signal of one polarity and magnitude to $C_0$ and $C_1$ and a fourth signal of opposite polarity but same magnitude to $C_2$,
    (6) converting $E_1$ into an analog signal using said error correcting capacitor array and applying said analog signal $E_1$ to said summing node, with the resulting analog signal $E_2$ at the summing node being proportional to the error in $C_2$,
    (7) converting $E_2$ into a digital signal using said error correcting capacitor array, and
    (8) repeating steps (4)-(7) for the remaining capacitors as required.

* * * * *

REEXAMINATION CERTIFICATE (727th)
United States Patent [19]
Tan

[11] B1 4,399,426

[45] Certificate Issued Jul. 14, 1987

[54] ON BOARD SELF-CALIBRATION OF ANALOG-TO-DIGITAL AND DIGITAL-TO-ANALOG CONVERTERS

[75] Inventor: Khen-Sang Tan, Plano, Tex.

[73] Assignee: Texas Instruments, Inc., Dallas, Tex.

Reexamination Request:
No. 90/001,019, May 30, 1986

Reexamination Certificate for:
Patent No.: 4,399,426
Issued: Aug. 16, 1983
Appl. No.: 260,435
Filed: May 4, 1981

[51] Int. Cl.[4] ............................................. H03M 1/10
[52] U.S. Cl. ....................... 340/347 CC; 340/347 AD; 340/347 DA; 364/571
[58] Field of Search ............... 340/347 AD, 347 DA, 340/347 CC; 364/571

[56] References Cited
U.S. PATENT DOCUMENTS
4,077,035 2/1978 Yee .............................. 340/347 AD FOREIGN PATENT DOCUMENTS
0134546 10/1979 Japan .......................... 340/347 DA OTHER PUBLICATIONS
McCreary "IEEE Journal of Solid State Circuits", vol. SC-10, No. 6, Dec. 1975, pp. 371-379.
Suarez "IEEE Journal of Solid State Circuits", vol. SC-10, No. 6, Dec. 1975, pp. 379-385.
Yee "IBM Technical Disclosure Bulletin", vol. 19, No. 6, Nov. 1976.

*Primary Examiner*—C. D. Miller

[57] ABSTRACT

A method and apparatus is disclosed which corrects for errors produced in data acquisition systems. Disclosed is a method and circuit for correcting errors, such as mismatch between binary weighted capacitors and offset, in a charge redistribution, weighted capacitor array analog-to-digital converter. A self-calibrating, self-correcting circuit is comprised of a second binary array of capacitors which adds to the regular charge redistribution capacitor array an error correcting signal to compensate for the mismatch. This error correcting signal is then stored and the other error correcting signals for other capacitors in the regular capacitor array are determined and subsequently stored for later correction of other capacitance mismatch.

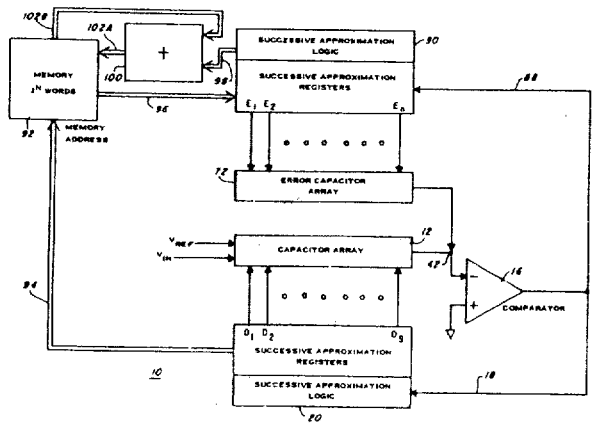

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 2 is cancelled.

Claims 1, 4 and 11 are determined to be patentable as amended.

Claims 3 and 5-10, dependent on an amended claim, are determined to be patentable.

New claim 12 is added and determined to be patentable.

1. A self-calibrating charge-redistribution analog-to-digital converter comprising:
   a first binary weighted capacitor array having a plurality of capacitors, one plate of each of said capacitors being electrically connected to a node,
   a comparator having one input electrically connected to said node,
   first logic means connected to said comparator output and said array for selectively connecting said capacitors to preselected voltages, [and]
   at least one second binary weighted error capacitor array electrically connected to said node and having a plurality of capacitors for determining the error correcting signal required at said node to correct the binary mismatch of preselected capacitors in said first array, each of said capacitors in said error capacitor array [being] *having one plate* connected through a scaling capacitor to said node *and an other plate connected to a reference potential*[.], *and*
   *second logic means connected to said comparator output for selecting said capacitors in said second binary array to provide said error correcting signal.*

4. A converter according to claim 1 further including a predetermined number of additional binary weighted error capacitor [array] *arrays* electrically connected to said node, each having a plurality of capacitors, each of said arrays determining the error signal required at said node to correct the binary mismatch of preselected capacitors of said array.

11. A method of calibrating capacitors $C_1-C_N$ in an A/D-D/A having a binary weighted capacitor array $C_1(LSB), C_2, C_3, C_4 \ldots C_N(MSB)$ plus one additional capacitor $C_0$ of weight corresponding to the least significant bit (LSB) in combination with an error correcting capacitor array combined at an analog summation node, comprising the steps of:
   (1) initializing the summation node to zero,
   (2) applying a first signal of one polarity and magnitude to $C_0$ and a second signal of opposite polarity but same magnitude to $C_1$ with the resulting signal $E_1$ at the summing node being proportional to the error in capacitor $C_1$,
   (3) converting signal $E_1$ into a digital signal using said error correcting capacitor array,
   (4) initializing the summation node again to zero, [a]
   (5) applying a third signal of one polarity and magnitude to $C_0$ and $C_1$ and a fourth signal of opposite polarity but same magnitude to $C_2$,
   (6) converting $E_1$ into an analog signal using said error correcting capacitor array and applying said analog signal $E_1$ to said summing node, with the resulting analog signal $E_2$ at the summing node being proportional to the error in $C_2$,
   (7) converting $E_2$ into a digital signal using said error correcting capacitor array, and
   (8) repeating steps (4)-(7) for the remaining capacitors as required.

*12. A converter according to claim 1 further comprising one or more switches for connecting said other plate of one or more of said plurality of capacitors to one or more reference potentials.*

* * * * *